United States Patent
Turner et al.

(10) Patent No.: US 9,571,078 B2
(45) Date of Patent: Feb. 14, 2017

(54) MODIFIED FLYING ADDER ARCHITECTURE

(71) Applicant: BAE SYSTEMS Information and Electronic Systems Integration Inc., Nashua, NH (US)

(72) Inventors: Steven E. Turner, Nashua, NH (US); Michael P. Anthony, Andover, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 24 days.

(21) Appl. No.: 14/808,653

(22) Filed: Jul. 24, 2015

(65) Prior Publication Data
US 2016/0028350 A1 Jan. 28, 2016

Related U.S. Application Data

(60) Provisional application No. 62/029,048, filed on Jul. 25, 2014.

(51) Int. Cl.
*H03K 5/13* (2014.01)
*H03K 5/00* (2006.01)

(52) U.S. Cl.
CPC ..... *H03K 5/131* (2013.01); *H03K 2005/00058* (2013.01)

(58) Field of Classification Search
CPC ..................................................... H03K 5/13
See application file for complete search history.

(56) References Cited

U.S. PATENT DOCUMENTS

| | | | |
|---|---|---|---|
| 5,764,087 A | 6/1998 | Clark | |
| 6,066,967 A | 5/2000 | Cahill et al. | |
| 6,329,850 B1 | 12/2001 | Mair et al. | |
| 7,065,172 B2 | 6/2006 | Xiu et al. | |
| 7,356,107 B2 | 4/2008 | Xiu et al. | |
| 7,372,340 B2 | 5/2008 | Xiu et al. | |
| 7,437,590 B2 | 10/2008 | Decker et al. | |
| 7,635,997 B1 | 12/2009 | Samad | |
| 7,702,708 B2 | 4/2010 | Xu et al. | |
| 7,772,893 B2 | 8/2010 | Chen et al. | |
| 8,664,988 B1 * | 3/2014 | Xiu ........................ | H03L 7/081 327/147 |
| 2009/0103604 A1 | 4/2009 | Xiu et al. | |

OTHER PUBLICATIONS

Sotiriadis, Paul P., "Theory of Flying-Adder Frequency Synthesizers—Part I: Modeling, Signals' Periods and Output Average Frequency", IEEE Transactions on Circuits and Systems-I: Regular Papers, pp. 1935-1948, vol. 57, No. 8, Aug. 2010.

(Continued)

*Primary Examiner* — Hai L Nguyen
(74) *Attorney, Agent, or Firm* — Hayes Soloway PC; Daniel J. Long

(57) ABSTRACT

According to an embodiment, an improved flying adder circuit, comprises a fine clock, a coarse pulse clock, a rising edge triggered output connected to both the fine clock and the coarse pulse clock, a pulse clock connected to the rising edge triggered output, an adder, a 12-bit register situated to receive a signal from the adder and the pulse clock, and a single bit register situated to receive a signal from the pulse clock.

8 Claims, 2 Drawing Sheets

(56) References Cited

OTHER PUBLICATIONS

Sotiriadis, Paul P., "Theory of Flying-Adder Frequency Synthesizers—Part II: Time- and Frequency-Domain Properties of the Output Signal", IEEE Transactions on Circuits and Systems-I: Regular Papers, pp. 1949-1963, vol. 57, No. 8, Aug. 2010.
Stork, Milan, "Flying Adder Principle Frequency Synthesizer", Dept. Applied Electronics and Telecommunications, University of West Bohemia, 30614 Plzen, Czech Republic, p. 11-161 to II-165, Dec. 1-4, 2011.
Electronic Solutions Inc., "CLASIC Proposal Abstract", Technical Volume, Oct. 2010.

* cited by examiner

MODIFIED FLYING ADDER ARCHITECTURE

RELATED APPLICATIONS

This application claims rights under 35 USC §119(e) from U.S. Application Ser. No. 62/029,048, filed: Jul. 25, 2014, the contents of which are incorporated herein by reference.

FIELD OF THE INVENTION

The present invention relates to frequency synthesis and more particularly to a modified flying adder for precision frequency and phase synthesis.

BACKGROUND OF THE INVENTION

The traditional flying adder architecture generates periodic signals with an average frequency output relative to a reference clock by selecting the phases of a set of reference clocks. In order to keep the number of reference clocks reasonably small, the clock phase selection is truncated. The truncation results in consecutive output periods that are not necessarily equal, but that result in a desired average output frequency. Although the desired average output frequency is achieved, the unequal period lengths result in undesired spurious outputs. There is therefore a need for a low power square wave reference without undesired spurious outputs.

More particularly, it will be noted that flying adder frequency synthesizers generate an output pulse train having a frequency but average it over time so that the falling and rising edges of the clocks would not necessarily occur at the same exact period. This results in time jitter when the clock edges are moving around. There are a considerable number of applications where this is acceptable. However, in other applications one requires the rising and falling edges of the clock to occur at precise times so that the clock edges happen at the exact time they are supposed to happen.

Time jitter in prior art flying adder frequency synthesizers is unacceptable in certain electronic warfare applications. For instance, for those systems involving jamming it is very important that the detecting system detects what they perceive to be their own signal returning to them. If the returned signal does not look like their own transmitted signal, the jamming signal will be ineffective because it can be ignored. Thus, there is a requirement for phase coherent signal generation for jamming signals so that the pulses in the jamming signals are edge to edge exact. These type of phase coherent signals are also useful for instance in phased array radars.

An architecture for generating almost-periodic digital signals of a desired average frequency based on a frequency reference clock is known in the art. As is usual, the circuit is driven by a family of uniformly phase shifted copies of a periodic square wave that can be generated by ring oscillator. While the flying adder results in a simple compact fully digital implementation offering good resolution, it also suffers from highly spurious output content due to phase truncation and phase jitter.

Because of its wide tuning range and instant response time, the prior art flying frequency adder is highly suitable for many system on-chip applications. The frequency is controlled by a frequency control word that can be an integer or a fractional number when high frequency resolution is desired. When the frequency control word is an integer, the flying frequency adder can be viewed as a phase divider which can achieve finer resolution than traditional frequency divider circuits are capable of. However, the frequency modulation involved in these flying adder synthesizers results in spurious spikes in the frequency spectrum. Although dithering methods can be used to eliminate or effectively reduce spurs, this approach comes at the cost of increased overall noise.

Thus, a heretofore unaddressed need exists in the industry to address the aforementioned deficiencies and inadequacies.

SUMMARY OF THE INVENTION

Embodiments of the present disclosure provide a system for a flying adder circuit. Briefly described, in architecture, one embodiment of the system, among others, can be implemented as follows. The flying adder circuit includes a fine pulse clock and a coarse pulse clock. A rising edge triggered output circuit is connected to both the fine pulse clock and the coarse pulse clock to provide a pulse train. An adder is provided. A register/accumulator is situated to receive a signal from said adder and said pulse train. A single bit register is situated to receive a signal from said rising edge triggered output.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
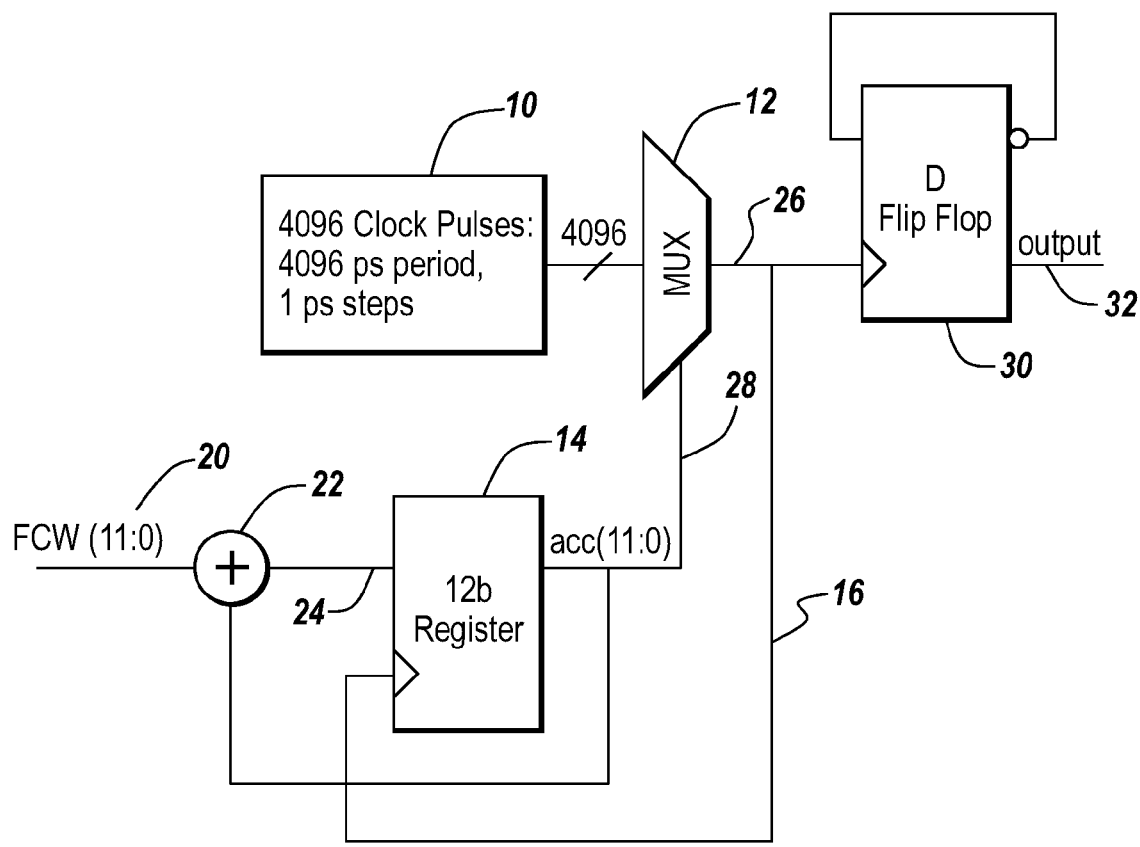
FIG. 1 is a diagrammatic illustration of a prior art flying adder frequency synthesizer utilizing a multiplexer to select which of the clock pulse trains from a reference clock is to be outputted, with the multiplexer being controlled by the contents of an accumulator in the form of a register having a frequency control word coupled to the input thereto.

In order to solve the phase jitter problem, the modified flying adder architecture may utilize a triggered fine/coarse clock output involving clock edge selection partitioning in order to achieve jitter free synthesis. The clock edge selection includes a reference clock for establishing the leading or rising edge of a coarse pulse coupled to the enable input of a rising edge triggered one-shot circuit. A fine pulse clock is coupled to the trigger input of this one shot circuit. The rising edge of the fine clock pulse is enabled by the rising edge of the coarse pulse clock that triggers through the fine clock pulse such that the rising edge of a pulse from the fine clock is time coincident with the rising edge of the coarse pulse clock pulse, thus to eliminate phase jitter. The result is that there does not need to be any averaging for the frequency synthesis. This type of system may allow for all of the necessary clock phases to effectively be selectable from a reduced set of reference phases and results in all equal output periods of the exact desired frequency.

According to an embodiment, an improved flying adder circuit comprises a fine pulse clock, a coarse pulse clock, and a rising edge triggered one-shot circuit connected to both the fine pulse clock and the coarse pulse clock. The output of the rising edge triggered one-shot circuit is coupled to a single bit register in the form of a D flip-flop, the output of which is the frequency synthesized output.

In order to provide frequency selection, the coarse pulse clock and the fine pulse clock are each coupled to separate multiplexers, with each multiplexer selecting which of a number of phase shifted clock inputs to output. Which input the multiplexer selects is set by the content of a 12-bit register/accumulator that is part of a flying adder. The frequency selection is provided by a frequency control word is that is added to the input of the register, with the register clocked by the pulsed output from the rising edge triggered one-shot circuit.

The flying adder circuit may have a fine clock with a 256 picosecond period available in 16 picosecond steps. This gives 16 different phases to be selected by the associated multiplexer. The coarse pulse clock may have a period between approximately 3840 picoseconds and 4096 picoseconds, available in 256 picosecond steps such that the coarse pulse clock multiplexer can select among 16 different phases. Moreover, an adjustable delay circuit may be interposed between the output of the rising edge triggered one-shot circuit and the input to the D flip-flop, in which the delay circuit is adjustable in one picosecond steps based on the contents of the 12 bit register.

In one embodiment, the frequency that the coarse pulse clock multiplexer outputs is determined by the most significant bits from the register. The frequency that the fine pulse clock multiplexer outputs is determined by the middle bits of the register and the adjustable delay is determined by the least significant bits from the register. It is noted that not only is the frequency jitter problem solved, in that one can provide phase coherent pulse trains, but the improved flying adder architecture can be utilized in a low-energy integrated circuit.

With known flying-adder architecture, the distinction of average frequency is critical where spectral purity is desired, such as in an RF application where the output of the flying-adder drives a mixer. The edges of the flying-adder generated clock can occur 'early' or 'late' relative to an ideal clock as disclosed by P. P. Sotiriadis, "Theory of Flying-Adder Frequency Synthesizers—Part II: Time- and Frequency-Domain Properties of the Output Signal," *IEEE Trans. Circuits Syst. I, Reg. Papers*, vol. 57, no. 8, pp. 1949-1963, August 2010. Also, the consecutive periods of the output may not be equal, but the time average of all periods of the output constitutes the desired period. In a simple example as disclosed by P. P. Sotiriadis, where the ideal clock would have a period of 3.5 time units, the flying adder output has a repeating pattern of 'high' for 4 time units, low for 1 time unit, high for 1 time unit, and low for 1 time unit. While this example achieves an average period of 3.5 time units, it also introduces deterministic jitter. It should be noted that the deterministic jitter is present only in flying-adders that truncate the accumulator output, so that not all of the valid clock edges are selectable from the multiplexer. In most implementations, truncation is necessary as it would be impractical to generate and multiplex hundreds of finely spaced clocks.

FIG. 1 is a diagrammatic illustration of a prior art flying adder frequency synthesizer utilizing a multiplexer to select which of the clock pulse trains from a reference clock is to be outputted, with the multiplexer being controlled by the contents of an accumulator in the form of a register having a frequency control word coupled to the input thereto. As shown in FIG. 1, generally, the flying adder selects between a number of different clock pulse trains generated by clock 10 which are coupled to a multiplexer 12 that selects a clock pulse train in accordance with the contents of register 14. The multiplexer selects between a number of clock pulse trains representing different frequencies. The output of multiplexer 12 is applied to clock register 14 as illustrated by line 16, whereas the content of register 14 is determined by a frequency control word 20 coupled to an adder 22 that adds the output of register 14 and the frequency control word together where it is used to increment register 14 as illustrated by input 24.

It will be appreciated that multiplexer 12 has an output signal 26, with the register contents applied over line 28. The output of the frequency synthesizer is available from a D flip-flop 30 which is a one bit register having as an input the output of multiplexer 12. The output of D flip-flop 30 is illustrated by reference character 32 and is a square wave of the desired frequency. As pointed out, the phase coherency of this output is in question which makes its use for phase concurrent frequency synthesis problematical.

Figure 2:
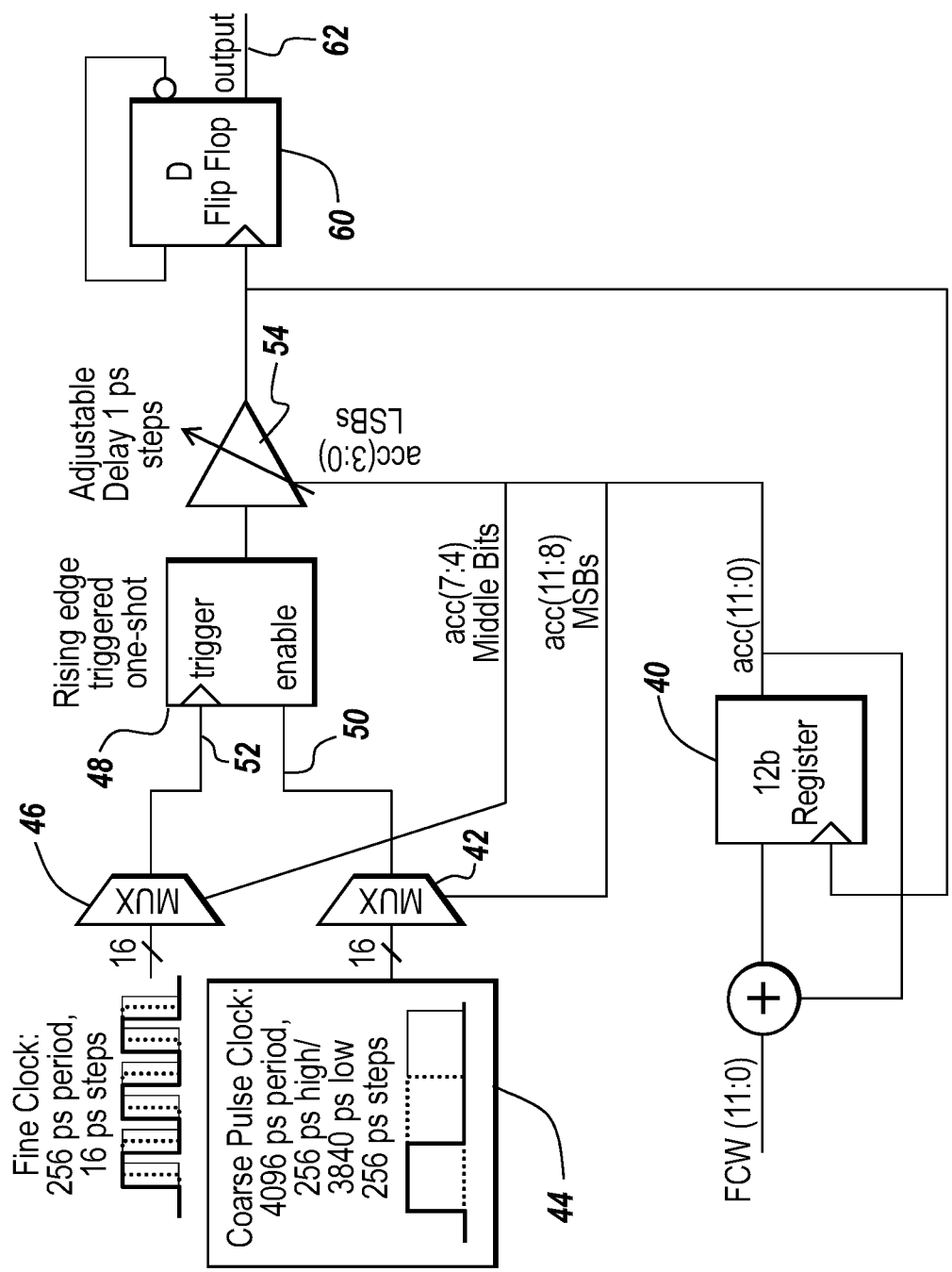
FIG. 2 is a diagrammatic illustration of a flying adder frequency synthesizer utilizing a fine pulse clock and a coarse pulse clock coupled to a rising edge triggered one shot circuit that establishes the coincidence of the rising edges of the clock pulses generated by the coarse pulse clock and the fine pulse clock, also showing an adjustable delay circuit coupled to the output of the one-shot circuit, with the multiplexers and the adjustable delay controlled by the contents of the register/accumulator utilized in the flying adder circuit, in accordance with the first exemplary embodiment of the present disclosure.

FIG. 2 is a diagrammatic illustration of a flying adder frequency synthesizer utilizing a fine pulse clock and a coarse pulse clock coupled to a rising edge triggered one shot circuit that establishes the coincidence of the rising edges of the clock pulses generated by the coarse pulse clock and the fine pulse clock, also showing an adjustable delay circuit coupled to the output of the one-shot circuit, with the multiplexers and the adjustable delay controlled by the contents of the register/accumulator utilized in the flying adder circuit, in accordance with the first exemplary embodiment of the present disclosure.

The modified flying adder architecture of FIG. 2 overcomes limitations of the traditional flying-adder by partitioning the clock edge selection. In FIG. 2, a 12 b register/accumulator 40 is partitioned into three parts to achieve 1 ps clock edge spacing and 4096 distinct edges. This design allows for ~100 kHz frequency spacing for output frequencies around 200 MHz with a 3.90625 GHz input clock rate. The MSBs of register 40 (acc(11:8)) are applied to multiplexer 42 provided with coarse clock pulse trains from coarse pulse clock 44. The output of multiplexer 42 represents the coarse selection of the appropriate clock edge. In one embodiment, these bits select a pulse that is high for $\frac{1}{16}$ (256 ps) of a 4096 ps period.

The middle bits of the register 40 (acc(7:4)) represent a fine clock selection. In the illustrated embodiment, the clock pulse trains feeding into the multiplexer 46 have a 256 ps period (3.90625 GHz) and 16 ps edge to edge spacing. The coarse and fine clocks are combined with logic that is enabled when the selected coarse clock is high and triggered on the rising edge of the selected fine clock. This circuit is a rising edge triggered one-shot circuit 48 that is enabled by the output of multiplexer 42 over line 50, with this circuit being triggered by a pulse from multiplexer 46 as illustrated at 52. The output of the rising edge triggered one-shot circuit is the equivalent of a traditional 12 b flying adder with the 4 LSBs truncated.

The final modification to the traditional flying adder design is an adjustable time delay 54 with 1 ps steps that is controlled by the register 40 LSBs (acc(3:0)). This adjustable time delay 54 has its output coupled to a D flip flop 60 as illustrated, with the output of the D flip flop illustrated at 62 constituting a phase coherent output.

The adjustable delay 54 adjusts the clock edge selection down to the finest resolution. An equivalent traditional flying-adder with no truncation would require 4096 clocks with 16 ps spacing and 256 ps period, while the modified flying-adder uses 16 clocks with a 256 ps spacing, a 256 ps pulse-width, a 4096 ps period; and a 1 ps resolution adjustable delay with 16 steps.

The output frequency ($f_{out}$) of the modified flying-adder in FIG. 2 is given by:

$$f_{out} = \frac{2^{11}}{FCW} f_{clk},$$

where FCW is the register 40 input from 0 to 4095 and $f_{clk}$ is 244.14 MHz. For example, if FCW=2500, fout=200 MHz.

In operation, the multiplexers may be controlled by the register contents of the 12 b accumulator. The accumulator value is used by the multiplexers to select which of their outputs is selected. For example, in one embodiment the coarse multiplexer 42 has 16 pulse clock trains that are offset by 256 ps. Depending on the MSBs of the accumulator, one of these pulse clock trains is selected as the multiplexer 42 output. The register/accumulator may be read in parallel.

As an example, if the register/accumulator output is 1 that is 0000 0000 0001 in binary. The MSBs are 0000, so the clock at the input 0 of multiplexer 44 is passed to its output. The Middle Bits are 0000, so the clock at the input 0 of multiplexer 46 is passed to its output. The LSBs are 0001, so a 1 ps delay setting is used for the adjustable delay 54. If the accumulator register output is 1337, it would equate to 0101 0011 1001 in binary. The MSBs are 0101, so the clock train at input 5 of multiplexer 42 is passed to its output. The Middle Bits are 0011, so the clock train at input 3 of multiplexer 46 is passed to its output. The LSBs are 1001, so a 9 ps delay setting is used for the adjustable delay 54.

It is noted that the FCW sets how rapidly the register/accumulator counts up. If the FCW=1, the register/accumulator sequence is 0, 1, 2, 3, 4, etc., before rolling over above 4095. If the FCW=100, the register/accumulator sequence is 0, 100, 200, 300, 400, etc., before rolling over above 4095.

The example of FIG. 2 could be modified in various manners to achieve the same performance goal, depending on the specifics of the implementation. For example, it could use 32 fine clocks, and 8 pulsed coarse clocks, or other combinations involving the selectable delay circuit.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:
1. A flying adder circuit, comprising:
a fine pulse clock;
a coarse pulse clock;
a rising edge triggered output circuit, connected to both the fine pulse clock and the coarse pulse clock to provide a pulse train;
an adder;
a register/accumulator situated to receive a signal from said adder and said pulse train; and
a single bit register situated to receive a signal from said rising edge triggered output.
2. The flying adder circuit of claim 1, wherein the fine clock has a 256 picosecond period.
3. The flying adder circuit of claim 1, wherein the fine clock has 16 picosecond steps.
4. The flying adder circuit of claim 1, wherein the coarse pulse clock has a period between approximately 3840 picoseconds and 4096 picoseconds.
5. The flying adder circuit of claim 1, wherein the coarse pulse clock has 256 picosecond steps.
6. The flying adder circuit of claim 1, wherein said fine pulse clock outputs a number of fine pulse clock pulse trains selectable by a first multiplexer and wherein the fine pulse clock pulse train selected by said first multiplexer is controlled by middle significant bits from said register/accumulator.
7. The flying adder circuit of claim 1, wherein said coarse pulse clock outputs a number of coarse pulse clock pulse trains selectable by a second multiplexer and wherein the coarse pulse clock pulse train selected by said second multiplexer is controlled by most significant bits from said register/accumulator.
8. The improved flying adder circuit of claim 1, further comprising a delay circuit coupled to said rising edge triggered output circuit for delaying the output of said rising edge triggered output circuit in accordance with least significant bits of said register/accumulator.

* * * * *